United States Patent
Tay et al.

(10) Patent No.: US 7,696,526 B2
(45) Date of Patent: Apr. 13, 2010

(54) SURFACE MOUNT OPTOELECTRONIC COMPONENT

(76) Inventors: Kheng Chiong Tay, 23, Taman Pokok Mangga 11, 75250 Melaka (MY); Khin Shin Lai, 33, Jalan Merbok 1/3, Taman Merbok Sek. 1, 75450 Melaka (MY); Tek Beng Low, 13-A, Bukit Piatu Flats, Melaka (MY)

( * ) Notice: Subject to any disclaimer, the term of this patent is extended or adjusted under 35 U.S.C. 154(b) by 111 days.

(21) Appl. No.: 10/766,468

(22) Filed: Jan. 29, 2004

(65) Prior Publication Data

US 2005/0168922 A1   Aug. 4, 2005

(51) Int. Cl.
*H01L 23/495* (2006.01)

(52) U.S. Cl. .................. 257/99; 257/100; 257/E25.028; 257/666; 257/693

(58) Field of Classification Search .................. 257/98, 257/99, 100, 666–677, 690, E25.028, E25.019; 362/610
See application file for complete search history.

(56) References Cited

U.S. PATENT DOCUMENTS

| | | | | |
|---|---|---|---|---|
| D432,095 S | * | 10/2000 | Seeger et al. | D13/182 |
| 6,335,548 B1 | * | 1/2002 | Roberts et al. | 257/98 |
| 6,355,946 B1 | * | 3/2002 | Ishinaga | 257/98 |
| 6,483,623 B1 | * | 11/2002 | Maruyama | 398/182 |
| 6,624,491 B2 | * | 9/2003 | Waitl et al. | 257/434 |
| D505,396 S | * | 5/2005 | Hoshiba | D13/180 |
| 2002/0121683 A1 | * | 9/2002 | Kelly et al. | 257/675 |
| 2002/0163001 A1 | * | 11/2002 | Shaddock | 257/79 |
| 2004/0000727 A1 | * | 1/2004 | Hsu | 257/787 |

FOREIGN PATENT DOCUMENTS

| | | | |
|---|---|---|---|
| JP | 06-85325 | * | 6/1994 |
| JP | 6-204568 | * | 6/1994 |

* cited by examiner

*Primary Examiner*—Sue Purvis
*Assistant Examiner*—Matthew Reames
(74) *Attorney, Agent, or Firm*—Finnegan, Henderson, Farabow, Garrett & Dunner, L.L.P.

(57) ABSTRACT

The invention relates to a surface mount optoelectronic component. A thick, electrically conductive material is used to serve as a base material for the assembly. An opaque plastic material is used to provide housing for the whole component. A cavity formed on a top surface of the optoelectronic component is designed within the plastic material. An optoelectronic chip is mounted within this cavity. This cavity is filled with a hard transparent or translucent resin material so that optical radiation may be transmitted or received via this window. Electrical connection(s) between the chip and the base material is/are provided by a metallic wire (4). Subsequent connections to external sub-systems, such as PCBs, are provided by the base material itself. No extra mechanical forming processes are necessary to create the connections. The base material extends all the way from a middle portion to a bottom surface of the optoelectronic component, and to one of the side surfaces, ultimately extending and protruding outside the package. The bottom surface is used for connection when a top illuminator is required. Alternatively, one of the side surfaces could be used for connection when the optoelectronic component is used as a side illuminator.

20 Claims, 3 Drawing Sheets

SURFACE MOUNT OPTOELECTRONIC COMPONENT

FIELD OF INVENTION

The invention relates to a surface mount optoelectronic component. The component is designed to be able to serve multiple modes of illumination, top, side, and bottom, depending on the method of mounting. Mounting connections are provided by an inherent electrically conductive base material. No mechanical forming processes are required to produce the desired mounting connection. The invention is also capable of higher heat dissipation due to the thicker base material and a heat sink incorporated into the design.

BACKGROUND OF THE INVENTION

In order to fulfill the different customers' requirements, different surface mount optoelectronic component configurations are available in the market today. Two key physical variations normally discussed for optoelectronic components are illumination direction and lead bending.

For illumination direction, customers may opt for either a top or side illumination version. As the name implies, top illuminators have an illumination source on a top portion of the optoelectronic component surface, while side illuminators have a source on a side surface of the optoelectronic component. The choice depends very much on the application itself. However, each of these configurations is unique in terms of physical dimension and is not interchangeable. Customers are expected to order the specific type of configuration for their needs.

As for lead bending, common versions available in the market include J-bend, gull-wing, reverse gull-wing, etc. These are the configurations used for connecting the mounting connections to sub-systems, such as PCBs. Based on current market information, there are still no surface mount optoelectronic packages available that do not require mechanical forming processes to create the desired mounting connections.

DETAIL DESCRIPTION OF THE INVENTION

Figures 1A, 1B:
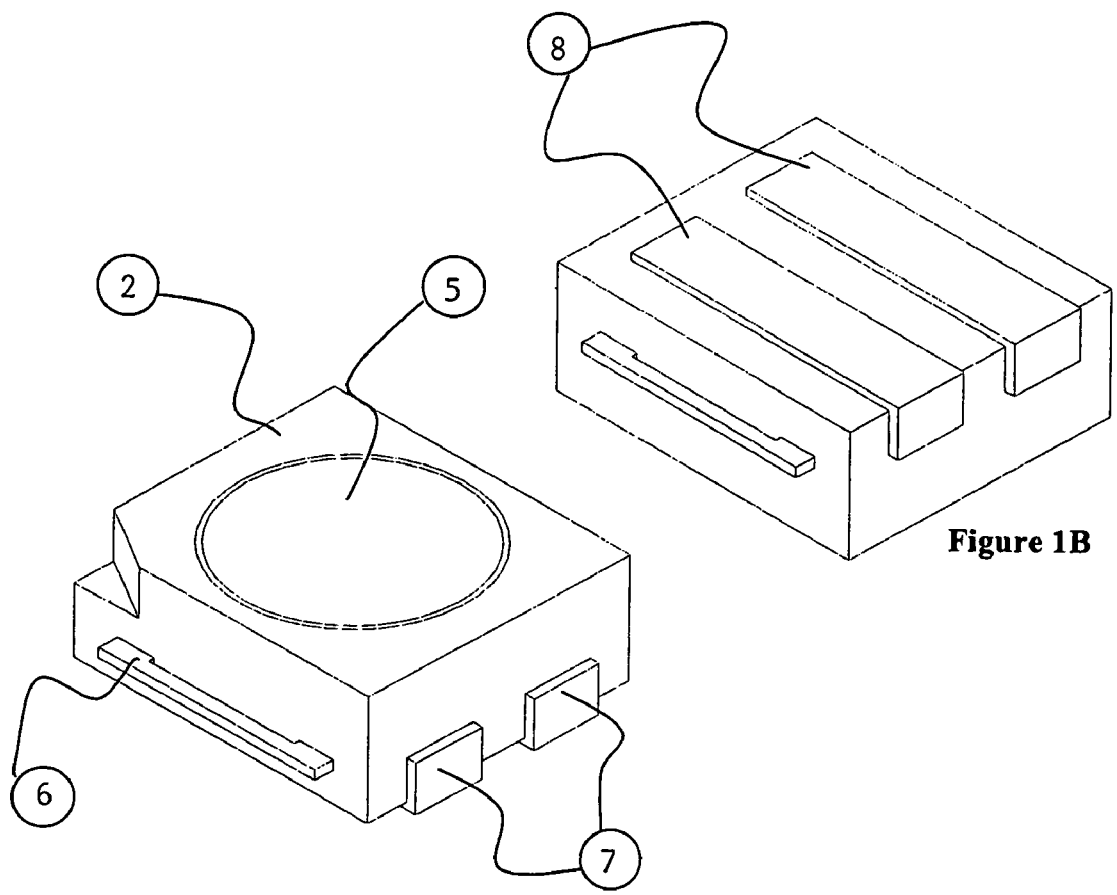
FIG. 1A is a three-dimensional top view of the invention.
FIG. 1B is a three-dimensional bottom view of the invention.
Figure 2:
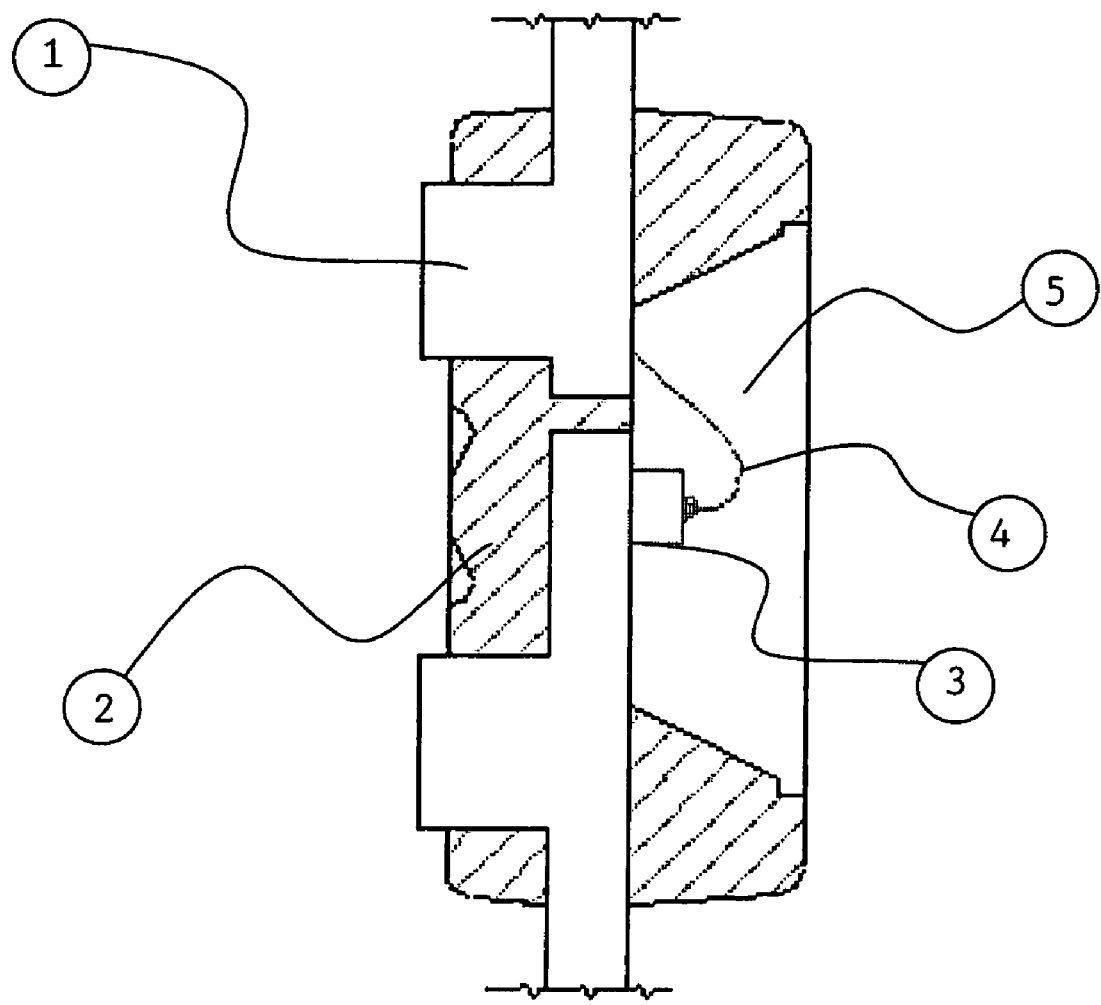
FIG. 2 is a cross sectional view of the invention depicting an assembly including a base material, a plastic housing, an optoelectronic chip, and a cavity within the plastic housing, which is filled by a transparent or translucent resin material.

The present invention relates to a surface mount optoelectronic component.

With reference to the invention, the optoelectronic component is based on surface mount technology. A thick, electrically conductive material (1), preferably a metal frame, is used to serve as a base material for the assembly. An opaque plastic material (2) is used to provide the housing for the whole component. A cavity (5) is designed within the plastic material. An optoelectronic chip (3) is mounted within this cavity. This cavity is filled with a hard transparent or translucent resin material so that optical radiation may be transmitted or received via this window. Electrical connection(s) between the optoelectronic chip (3) and the base material (1) is/are provided by a metallic wire (4).

Subsequent connections to external sub-systems, such as PCBs, are provided by the base material (1) itself, typically by soldering. No extra mechanical forming processes are necessary to create the external connections. The base material (1) extends all the way from a middle portion of the optoelectronic component to a bottom surface (8), and to one of the side surfaces (7), ultimately extending and protruding outside the plastic package. The bottom surface (8) is used for connection when a top illuminator is required. Alternatively, one of the side surfaces (7) could be used for connection when the optoelectronic component is used as a side illuminator. This feature ultimately yields to a universal package design for optoelectronic components, where both the top and side illumination capabilities are combined into one single package. The base material can also protrude to other side surfaces of the optoelectronic component, with protrusions (6) formed in the side surface of the package. These protrusions (6) act as heat sinks to improve heat dissipation from the optoelectronic component.

Figure 3:
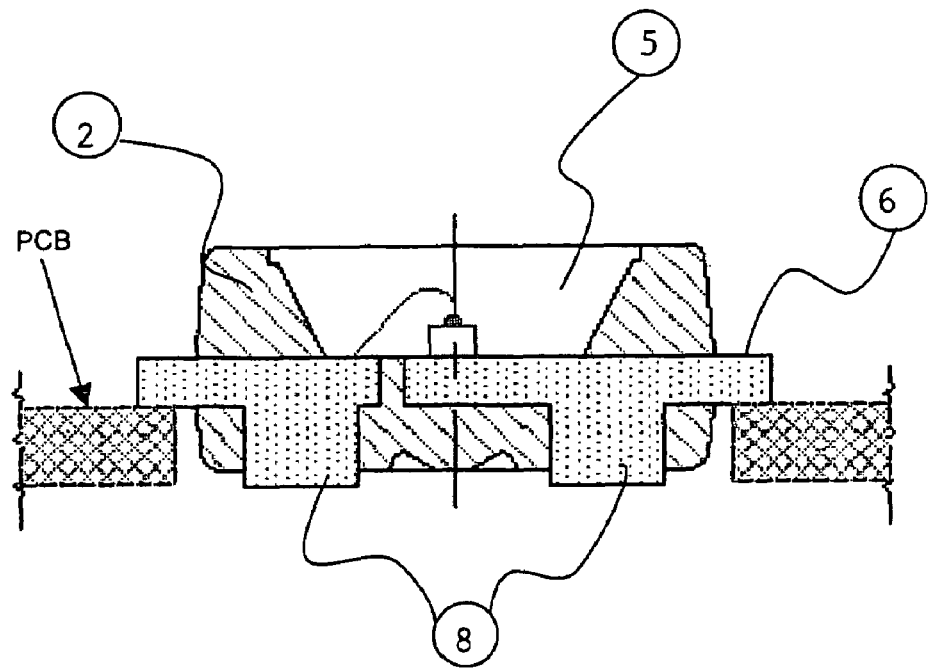
FIG. 3 shows the invention mounted onto a PCB sub-system using side protrusions as a means for electrical connection.
Figure 4:
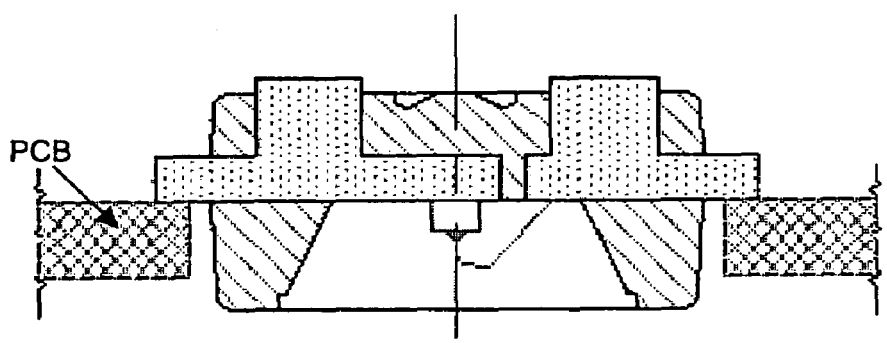
FIG. 4 shows the invention mounted onto a PCB sub-system, similar to FIG. 3, but on a reverse orientation so as to provide bottom illumination.

In another mounting configuration, the side protrusions (6) can also be used as a means of connection to external surfaces, such as PCBs, as illustrated in FIGS. 3 and 4. In such a mounting configuration, the component sits in the sub-system and can be used for either top or bottom illumination. This mounting configuration reduces the height profile of the optoelectronic component above the sub-system, since a portion of the optoelectronic component is below the sub-system's surface. The other two exposed surfaces (7) and (8) act as heat sinks when used in such mounting configuration.

Inherent in the design is that no lead formations are required since the external connections are provided by the base material (1) itself. This feature eliminates mechanical stresses that are typically subjected to the package during conventional forming processes. Consequently, the package robustness and reliability is greatly enhanced.

Another inherent feature of this invention is the relatively thicker base material compared to other corresponding products in the market. This, coupled with the heat sinks, greatly improves the package's ability to dissipate heat. Higher current or power can also be applied to the devices to yield better performance.

The invention claimed is:

1. An optoelectronic component based on a surface mount technology, the optoelectronic component comprising:
    an electrically conductive frame forming a base including multiple separate base sections for an assembly;
    an opaque plastic material forming a housing for the assembly;
    a cavity formed within the plastic material;
    at least one protrusion extending from a side surface of the housing to provide heat dissipation; and
    at least one optoelectronic chip mounted in the cavity,
    wherein the base emanates from an internal middle portion and each of the base sections protrudes from a bottom surface and at least one of two other side surfaces of the housing, so as to extend past the bottom surface and the two other side surfaces of the housing, the bottom surface and the two other side surfaces of the housing providing external mounting connection terminals.

2. The optoelectronic component as claimed in claim 1, wherein the cavity is filled with a transparent or translucent resin material.

3. The optoelectronic component as claimed in claim 1, wherein an electrical connection between the at least one optoelectronic chip and the base is provided by a metallic wire.

4. The optoelectronic component as claimed in claim 1, wherein the external mounting connection terminals are provided for connecting to external sub-systems.

5. The optoelectronic component as claimed in claim 1, wherein the base protrudes outside the plastic material.

6. The optoelectronic component as claimed in claim 1, wherein the external mounting connection terminals are provided without any lead formations.

7. The optoelectronic component as claimed in claim 1, wherein the at least one protrusion extending from a side surface to provide heat dissipation extends further from the side surface than the base protrusion on the bottom surface extends from the bottom surface.

8. The optoelectronic component as claimed in claim 1, wherein the base protrusion on the bottom surface extends along the bottom surface for at least a third of a length of the bottom surface.

9. The optoelectronic component as claimed in claim 1, wherein the base comprises two separate base sections, each of the base sections protruding from the bottom surface and at least one of the two other side surfaces.

10. The optoelectronic component as claimed in claim 9, wherein one of the two base sections is larger than the other in the middle portion and the protrusions of the two base sections have identical dimensions outside the housing.

11. The optoelectronic component as claimed in claim 10, wherein the optoelectronic chip is arranged on the larger one of the two base sections.

12. An optoelectronic component based on a surface mount technology, the optoelectronic component comprising:
an electrically conductive frame forming a base for an assembly, the base including multiple separate base sections;
an opaque plastic material forming a housing for the assembly;
a cavity formed within the plastic material;
at least one protrusion extending from a side surface of the housing to provide heat dissipation; and
at least one optoelectronic chip mounted in the cavity, wherein the electrically conductive frame emanates from an internal middle portion and each of the base sections protrudes to at least one of two other side surfaces and a bottom surface of the housing, so as to extend past the two other side surfaces and the bottom surface of the housing, the bottom surface and the two other side surfaces of the housing providing external mounting connection terminals.

13. The optoelectronic component as claimed in claim 12, wherein the cavity is filled with a transparent or translucent resin material.

14. The optoelectronic component as claimed in claim 12, wherein the external mounting connection terminals are provided without any lead formations.

15. The optoelectronic component as claimed in claim 12, wherein an electrical connection between the at least one optoelectronic chip and the base is provided by a metallic wire.

16. The optoelectronic component as claimed in claim 12, wherein the external mounting connection terminals are provided for connecting to external sub-systems such as PCBs.

17. The optoelectronic component as claimed in claim 12, wherein the electrically conductive frame comprises two separate frames, each of the frames protruding from at least one of the two other side surfaces.

18. The optoelectronic component as claimed in claim 17, wherein one of the two frames is larger than the other in the middle portion.

19. The optoelectronic component as claimed in claim 18, wherein the protrusions of the two frames have identical dimensions outside the housing.

20. The optoelectronic component as claimed in claim 18, wherein the optoelectronic chip is arranged on the larger one of the frames.

* * * * *

UNITED STATES PATENT AND TRADEMARK OFFICE
CERTIFICATE OF CORRECTION

PATENT NO. : 7,696,526 B2  
APPLICATION NO. : 10/766468  
DATED : April 13, 2010  
INVENTOR(S) : Kheng Chiong Tay, Khin Shin Lai and Tek Beng Low It is certified that error appears in the above-identified patent and that said Letters Patent is hereby corrected as shown below:

Title page, delete item 76 in its entirety and insert:

--(75) Inventors: Kheng Chiong Tay, Melaka (MY); Khin Shin Lai, Melaka (MY); Tek Beng Low, Melaka (MY)--

After new item 75, insert:

--(73) Assignee: Dominant Opto Technologies SDN BHD, Melaka (MY)--

Signed and Sealed this

Third Day of August, 2010

David J. Kappos  
*Director of the United States Patent and Trademark Office*